(12) United States Patent
Cilek et al.

(10) Patent No.: US 10,175,297 B2
(45) Date of Patent: Jan. 8, 2019

(54) MEASURING A SLEW RATE ON-CHIP

(71) Applicant: INTERNATIONAL BUSINESS MACHINES CORPORATION, Armonk, NY (US)

(72) Inventors: Fatih Cilek, Boeblingen (DE); Guenther Hutzl, Sindelfingen (DE); Michael Koch, Ehningen (DE); Christian I. Menolfi, Langnau am Albis (CH); Dieter Nissler, Leinfelden-Echterdingen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 15/208,642

(22) Filed: Jul. 13, 2016

(65) Prior Publication Data
US 2018/0017621 A1 Jan. 18, 2018

(51) Int. Cl.
*G01R 31/00* (2006.01)
*G01R 31/3193* (2006.01)

(52) U.S. Cl.
CPC .............. *G01R 31/31937* (2013.01)

(58) Field of Classification Search
USPC ............ 324/523, 535, 617, 618, 76.22; 327/170–172, 175
See application file for complete search history.

(56) References Cited

U.S. PATENT DOCUMENTS

| | | | |
|---|---|---|---|
| 7,299,438 B2 | 11/2007 | Hosono | |
| 7,548,822 B2 | 6/2009 | Chuang et al. | |
| 7,808,268 B2 | 10/2010 | Bucossi et al. | |
| 8,519,761 B1 * | 8/2013 | Kossel | H03K 5/13 327/170 |
| 2015/0171834 A1 | 6/2015 | Arp et al. | |
| 2015/0192485 A1 | 7/2015 | Slechta | |

OTHER PUBLICATIONS

Ghosh et al, "Slew-Rate Monitoring Circuit for On-Chip Process Variation Detection", IEEE Transactions on Very Large Scale Integration (VLSI) Systems, Sep. 2013, pp. 1683-1692, vol. 21, No. 9.

* cited by examiner

*Primary Examiner* — Vincent Q Nguyen
(74) *Attorney, Agent, or Firm* — Michael O'Keefe

(57) ABSTRACT

A method, apparatus, and computer program product for measuring a slew rate of a digital high speed repeating signal on-chip including, transforming the rising and the falling edges of the signal into a digital pulse signal each; and selecting the digital pulse signals corresponding either to the rising edge or to the falling edge of the signal. Further the method including converting the selected digital pulse signals into an average DC voltage equivalent to the pulse width of the respective digital pulse signal; as well as converting each DC voltage into a binary value.

20 Claims, 11 Drawing Sheets

MEASURING A SLEW RATE ON-CHIP

BACKGROUND

The present invention relates in general to data processing systems, and in particular, to a method, an apparatus as well as a computer program product and a system for measuring a slew rate of a digital high speed repeating signal on-chip.

A clock tree or clock grid may distribute a clock signal to an integrated circuit. Often design requirements such as duty cycle, skew, and slew rate may not be reached due to design limitations. Additionally, design variations may cause unpredictable inaccuracies and unexpected deviations from these design requirements.

Therefore displaying the time behavior of critical signals (e.g. a clock signal) on integrated circuits is important for the functionality and reliability of a VLSI chip. Beside the signal waveform the slew rate is a relevant figure of merit and has to be monitored to meet design requirements.

SUMMARY

A method is proposed for measuring a slew rate of a digital high speed repeating signal on-chip including transforming the rising and the falling edges of the signal into a digital pulse signal each, wherein a pulse width of the digital pulse signal corresponds to the slew rate of the rising and the falling edges, selecting one of the digital pulse signals corresponding either to the rising edge or to the falling edge of the signal, selecting the other one of the pulse signals corresponding either to the falling edge or to the rising edge of the signal, converting the selected digital pulse signals into an average DC voltage equivalent to the pulse width of the respective digital pulse signal, converting each DC voltage into a binary value.

An on-chip slew rate measurement method and apparatus is proposed that measures the slew rate of digital periodic signals using among others a duty cycle sensor. The measurement of the slew rate is performed on-chip because of the risk of distortion from the observed signal by external measurement equipment. The inventive measuring method is able to distinguish between a rising edge of the digital signal and the falling edge. Due to the measurement on-chip there is no extra sense pin required on the chip for sensing the DC voltage signal. The slew rate measurement is done by a combination of digital and analog circuits. In principal the rising and falling edges are transformed to equivalent pulse widths, which may be converted to analog DC voltages equivalent to the pulse widths. These analog DC voltages may then be converted to binary values representing the pulse widths and thus the slew rates of the rising or falling edges. The conversion may in particular be done by comparing the DC voltage to a reference voltage.

An apparatus is proposed for measuring a slew rate of a digital high speed repeating signal on-chip including a window comparator unit, configured to transform the rising and the falling edges of the signal into a digital pulse signal each, where a pulse width of the digital pulse signal corresponds to the slew rate of the rising and the falling edges, an edge selection unit, configured to select one of the digital pulse signals corresponding either to the rising edge or to the falling edge of the signal as well as configured to select the other one of the pulse signals corresponding either to the falling edge or to the rising edge of the signal, a duty cycle sensor unit, configured to convert the selected digital pulse signals into an average DC voltage equivalent to the pulse width of the respective digital pulse signal and to convert each DC voltage into a binary value.

The inventive method for measuring a slew rate of a digital high speed repeating signal on-chip is implemented on the proposed apparatus, performing the different steps on different components of the apparatus, such as the window comparator unit for transforming the rising and the falling edges of the signal into a digital pulse signal each, the edge selection unit for selecting one of the digital pulse signals corresponding either to the rising edge or to the falling edge of the signal, and the duty cycle sensor unit for converting the selected digital pulse signals into a binary value.

A computer program product is proposed for measuring a slew rate of a digital high speed repeating signal on-chip, the computer program product including a computer readable storage medium having program instructions embodied therewith, the program instructions executable by a computer to cause the computer to perform a method including transforming the rising and the falling edges of the signal into a digital pulse signal each, where a pulse width of the digital pulse signal corresponds to the slew rate of the rising and the falling edges, selecting one of the digital pulse signals corresponding either to the rising edge or to the falling edge of the signal, selecting the other one of the pulse signals corresponding either to the falling edge or to the rising edge of the signal, converting the selected digital pulse signals into an average DC voltage equivalent to the pulse width of the respective digital pulse signal, and converting each DC voltage into a binary value.

Further, a data processing system for execution of a data processing program is proposed, comprising computer readable program instructions for performing the method described above.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
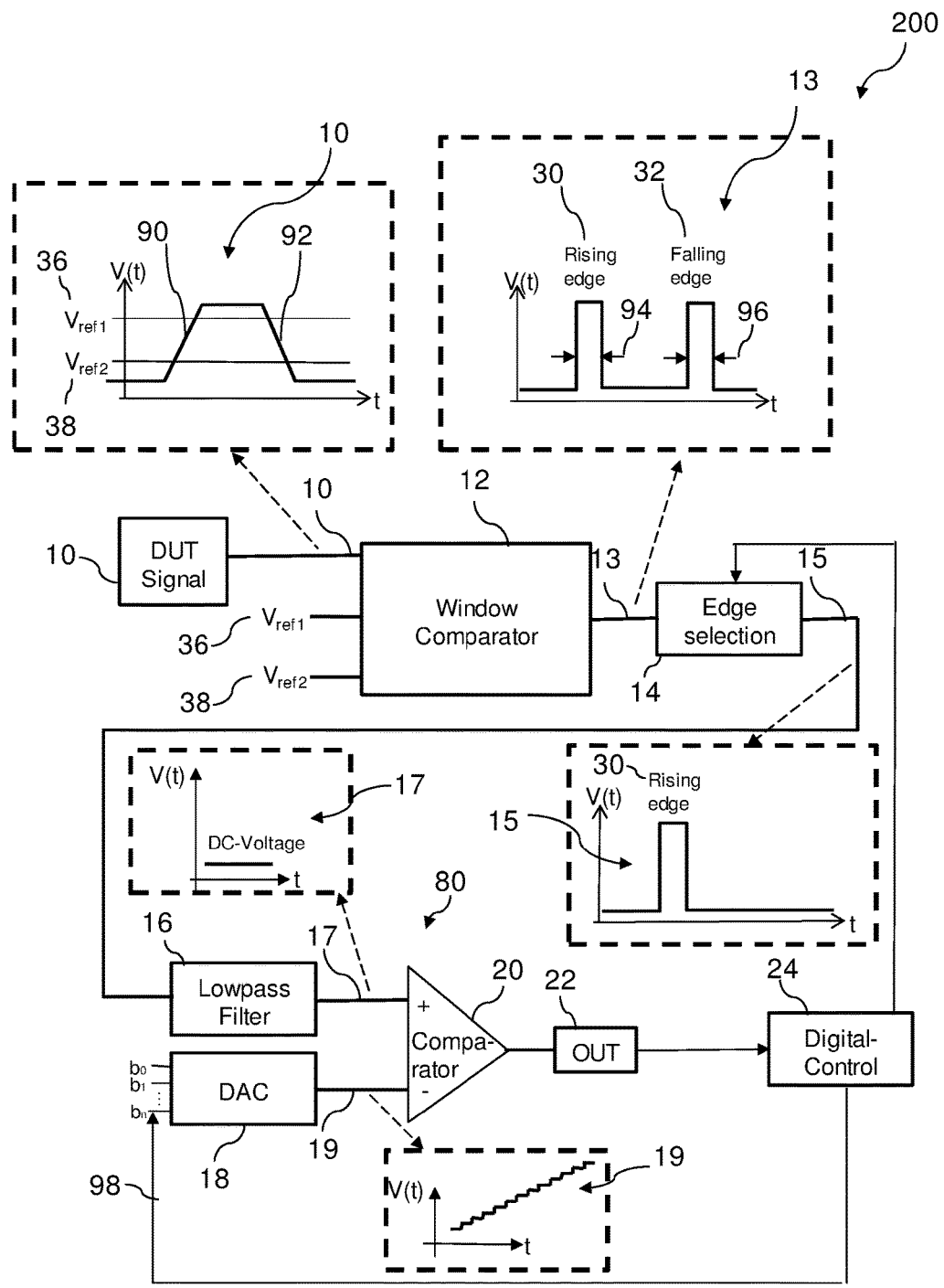
FIG. 1 is a block diagram of an apparatus for measuring a slew rate of a digital high speed repeating signal on-chip, displaying the processed signals, in accordance with an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to data processing systems. An embodiment by which to measure a slew rate of a high speed repeating single on-chip is described in detail below by referring to the accompanying drawings in FIGS. 1 to 11. Those skilled in the art will readily appreciate that the detailed description given herein with respect to these figures is for explanatory purposes as the invention extends beyond these limited embodiments.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

The illustrative embodiments are sometimes described herein using particular technologies only as an example for the clarity of the description. The illustrative embodiments may be used for measuring a slew rate of a digital high speed repeating signal 10 on-chip including, (i) a window comparator unit 12, configured to transform the rising and the falling edges 90, 92 of the signal 10 into a digital pulse signal 30, 32 each, wherein a pulse width 94, 96 of the digital pulse signal 30, 32 corresponds to the slew rate of the rising and the falling edges 90, 92; further (ii) an edge selection unit 14, configured to select one of the digital pulse signals 30, 32 corresponding either to the rising edge 90 or to the falling edge 92 of the signal 10 and is configured to select the other one of the digital pulse signals 32, 30 corresponding either to the falling edge 92 or to the rising edge 90 of the signal 10; followed by (iii) a duty cycle sensor unit 80, including an integrator unit 16, a digital to analog converter 18, a comparator 20, an output unit 22 and a digital control unit 24, where the duty cycle sensor unit 80 is configured to convert the digital pulse signals 30, 32 is averaged into a DC voltage 17 equivalent to the pulse widths 94, 96 of the respective digital pulse signal 30, 32; and to convert the DC voltage 17 into a binary value 98.

FIG. 1 depicts a block diagram of the apparatus 200 for measuring a slew rate of a digital high speed repeating signal (hereinafter "signal") 10 on-chip according to an embodiment of the invention. In the diagram the processed signals are displayed according to different components of the apparatus 200.

The slew rate measurement is done by a combination of digital and analog circuits as shown in FIG. 1. In principal the rising and falling edges 90, 92 of the signal 10 of a device under test (DUT), shown in insert 10 of FIG. 1, are transformed to pulse widths 94, 96 of the digital pulse signals 30, 32. In the insert 10, the x-axis is time and the y-axis is voltage as a function of time. For this purpose the signal 10 is connected to a window comparator unit 12.

Figure 9:
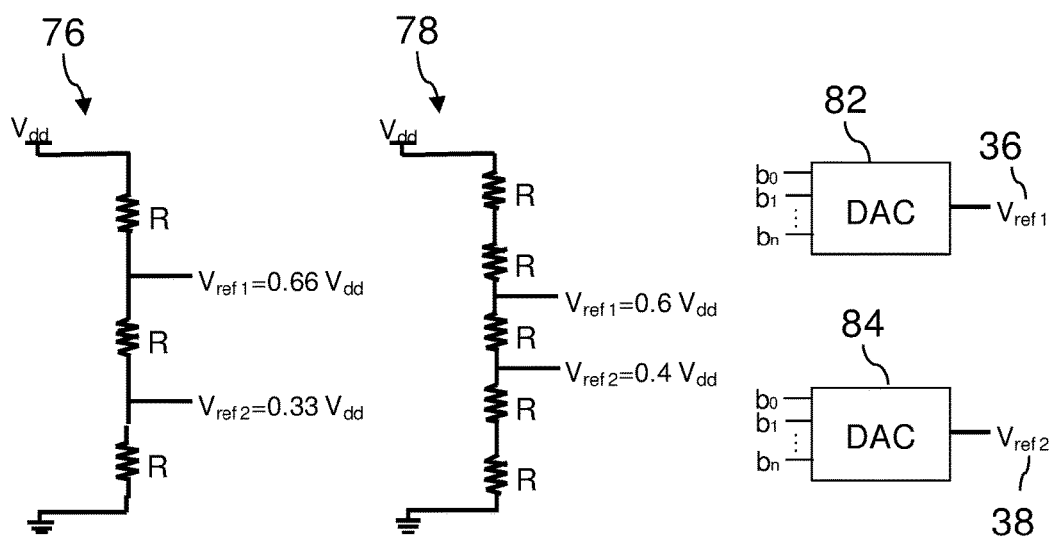
FIG. 9 shows different components for generating a reference voltage according to an embodiment of the invention, in accordance with an embodiment of the present invention.

The window comparator unit 12 has additional inputs of a first reference voltage 36, and a second reference voltage 38. The first and second reference voltages 36, 38 are threshold voltages that define the range of the switching window for an output of the window comparator unit 12. The first and second reference voltages 36, 38 may be generated, e.g., by a resistive voltage divider 76, 78, as shown in FIG. 9, or if the reference voltages 36, 38 shall be tuned, by a digital to analog converter (DAC), 82, 84, as shown in FIG. 9. The output of the window comparator unit 12 are digital pulse signals 30, 32, where the pulse width represent the time difference between the both reference voltages and these are equivalent to the slew rate, as shown in insert 13. In the insert 13, the x-axis is time and the y-axis is voltage as a function of time. A digital pulse signal 30, 32 for the rising edge 90 and the falling edge 92 of the signal 10 is generated.

The edge selection unit 14 is used to separate one of the edges 90, 92 in the next circuit. With the edge selection unit 14 an irrelevant signal of the digital pulse signal 30, 32 is masked out. An output of the edge selection unit 14 is an input signal 15, shown in insert 15. In the insert 15, the x-axis is time and the y-axis is voltage as a function of time.

Next the pulse widths 94, 96 of the relevant signal of the digital pulse signal 30, 32 is determined, using a duty cycle sensor 80, including a low pass filter as an integrator unit 16, a digital analog converter (DAC) 18, a comparator 20, an output unit 22 and a digital control unit 24. In principal the digital pulse signal 30, 32 is averaged to a DC voltage level 17, shown in insert 17, and the dimension of the DC voltage 17 by the duty cycle sensor 80 converted to a binary value 98 with a compare process to a reference voltage 19, shown in insert 19. In the inserts 17 and 19, the x-axis is time and the y-axis is voltage as a function of time. The compare process is performed by the comparator 20, which receives as an input the DC voltage 17 and the reference voltage 19. The reference voltage generator may be realized, for example, as the DAC 18. The input of the DAC 18 and the edge selection unit 14 are controlled from the digital control unit 24. This controls for example the binary search algorithm in order to fasten the compare process to find the right value. An output of the comparator 20 is fed to the output unit 22, which is fed to the digital control unit 24, which adapts the binary value 98 as input of the DAC 18 and thus the reference voltage 19 until the reference voltage 19 exceeds the integrator unit 16 output of the DC voltage 17. Then the output of the comparator 20 toggles. At this point the difference between reference voltage 19 and DC voltage 17 is minimal. Thus the binary value 98 corresponds to the DC voltage 17.

After the DC voltage 17 is determined and output as the binary value 98, the pulse widths 94, 96 can be calculated by equation 1 shown below:

$$\text{Pulse\_width}=(DC\_\text{voltage}/V_{dd})\times P_{cycletime} \quad (1)$$

where $V_{dd}$ is the voltage corresponding to a full cycle of the signal 10 and $P_{cycletime}$ is a cycle time corresponding to the full cycle of the signal 10. A slew rate of the rising edge 90 or the falling edge 92 may then be calculated by equation 2 shown below:

$$\text{Slew\_rate}=(V_{ref1}-V_{ref2})/\text{Pulse\_width} \quad (2)$$

where $V_{ref1}$ is the first reference voltage and $V_{ref2}$ is the second reference voltage. The first reference voltage $V_{ref1}$ may be higher than the second reference voltage $V_{ref2}$.

Figure 2:
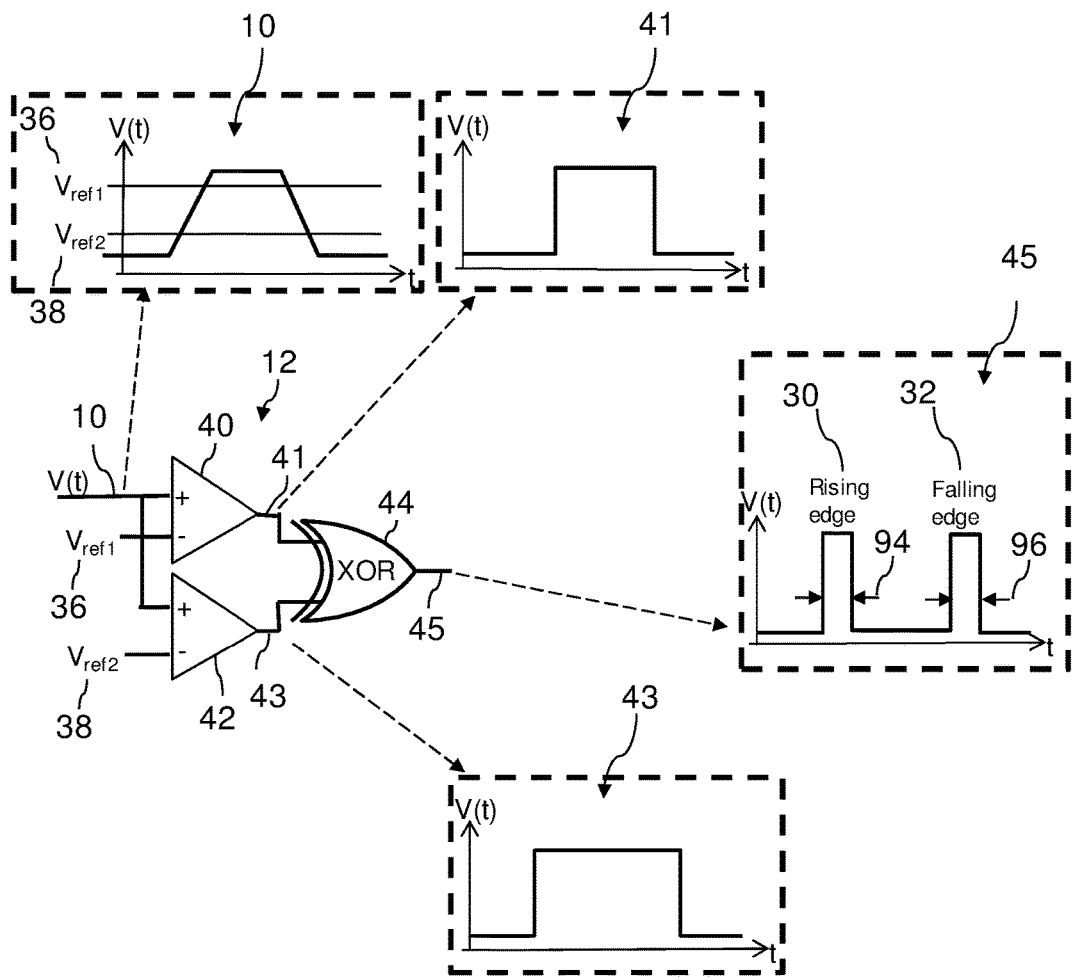
FIG. 2 is a functional diagram of a window comparator unit with an XOR gate, displaying the processed signals, in accordance with an embodiment of the present invention.
Figure 3:
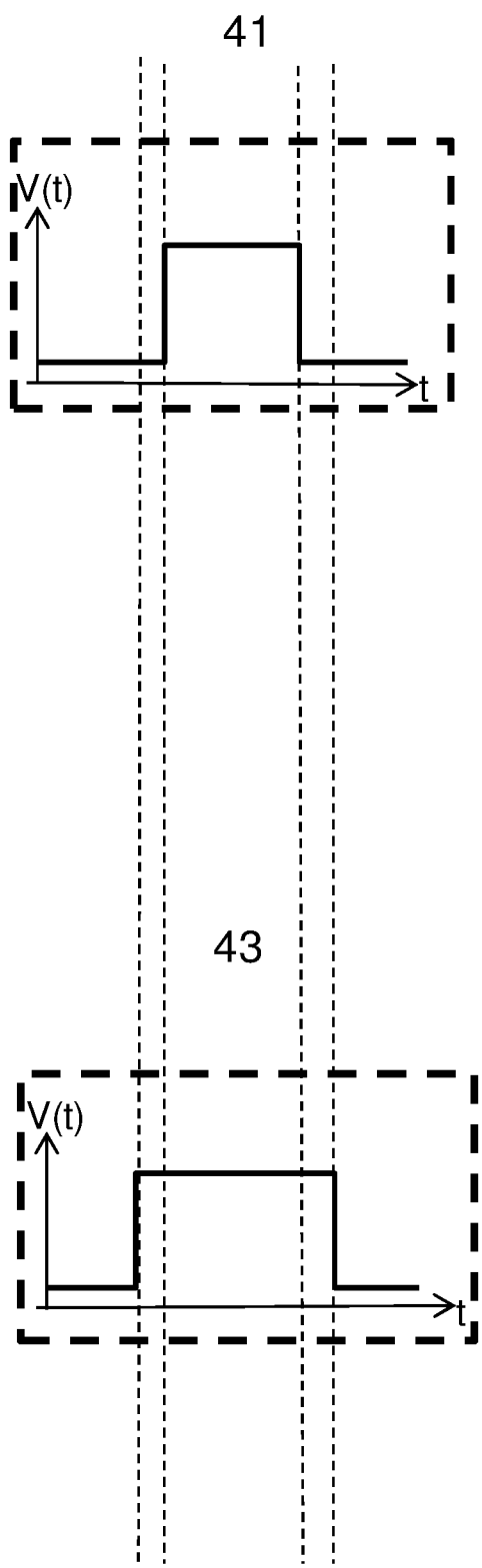
FIG. 3 shows synchronized signals of the window comparator unit according to FIG. 2, in accordance with an embodiment of the present invention.

In FIG. 2 a functional diagram of a window comparator unit 12, as shown in FIG. 1, with an XOR gate 44 according to an embodiment of the invention is shown, also displaying the processed signals, which are depicted in FIG. 3 as synchronized signals.

The core elements of the window comparator unit 12 include a first and a second comparator 40, 42, that detect two threshold voltages, the first reference voltage 36 and the second reference voltage 38. In the circuit it is detected by the first comparator 40 when the signal 10 is higher than the first reference voltage 36 and by the second comparator 42 when the signal 10 is higher than the second reference voltage 38, respectively, leading to a first selection pulse signal 41 and a second selection pulse signal 43, shown in respective inserts 41, 43. In the inserts 41 and 43 the x-axis is time and the y-axis is voltage as a function of time. This is achieved by feeding the signal 10 to the positive inputs of the first, second comparators 40, 42 and feeding the first reference voltage 36 to the negative input of the first comparator 40 and the second reference voltage 38 to the negative input of the second comparator 42.

Then the XOR gate 44 generates digital pulse signals 45 of the digital pulse signals 30, 32, for the rising edge 90 and the falling edge 92, respectively, where the pulse widths 94, 96 are the timing ranges between the second and the first reference voltages 38, 36. The digital pulse signals 45 are shown in the insert 45. In the insert 45, the x-axis is time and the y-axis is voltage as a function of time.

In a preferred embodiment, a response time of the first, second comparators 40, 42 is smaller than the cycle time of the signal 10.

In FIG. 3 the synchronized first and second selection pulse signals 41, 43 are shown. The first selection pulse signal 41 corresponds to the time where the signal 10 is higher than the first reference voltage 36 and that the second selection pulse signal 43 corresponds to the time where the signal 10 is higher than the second reference voltage 38. Processing the first and second selection pulse signals 41, 43 by the XOR gate 44 delivers as an output the two digital pulse signals 45 for the rising edge 90 and the falling edge 92, respectively, shown in FIG. 2.

Figure 4:
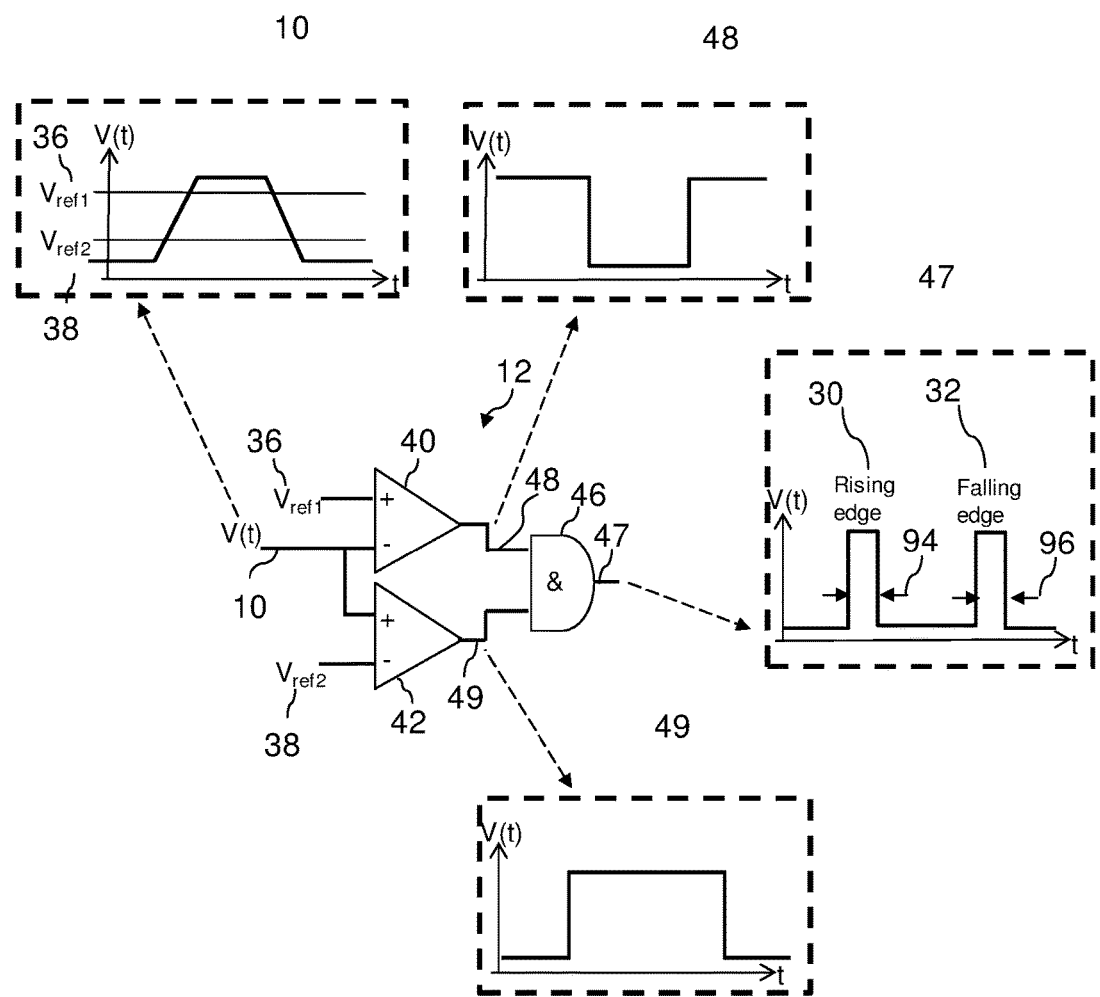
FIG. 4 is a functional diagram of a window comparator unit with an AND gate, displaying the processed signals, in accordance with an embodiment of the present invention.

FIG. 4 depicts a functional diagram of a window comparator unit 12, as shown in FIG. 1, with an AND gate 46 according to a further embodiment of the invention. In this embodiment it is detected by the first comparator 40 when the signal 10 is lower than the first reference voltage 36 and by the second comparator 42 when the signal 10 is higher than the second reference voltage 38, respectively, leading to a first selection pulse signal 48 and a second selection pulse signal 49, shown in the respective inserts 48, 49. In the inserts 48, 49, the x-axis is time and the y-axis is voltage as a function of time. This is achieved by changing the input of the first comparator 40 with respect to the embodiment shown in FIG. 2. In FIG. 4 the signal 10 is fed to the negative input of the first comparator 40 and to the positive input of the second comparator 42 and the first reference voltage 36 to the positive input of the first comparator 40 and the second reference voltage 38 to the negative input of the second comparator 42. Thus the first selection pulse signal 48 is inverted to the first selection pulse signal 41 shown in FIG. 2.

The AND gate 46 generates digital pulse signals 47 of the digital pulse signals 30, 32, for the rising edge 90 and the falling edge 92, respectively, where the pulse widths 94, 96 are the timing ranges between the second and the first reference voltages 38, 36. The digital pulse signals 47 are shown in the insert 47. In the insert 47, the x-axis is time and the y-axis is voltage as a function of time.

Figure 5:
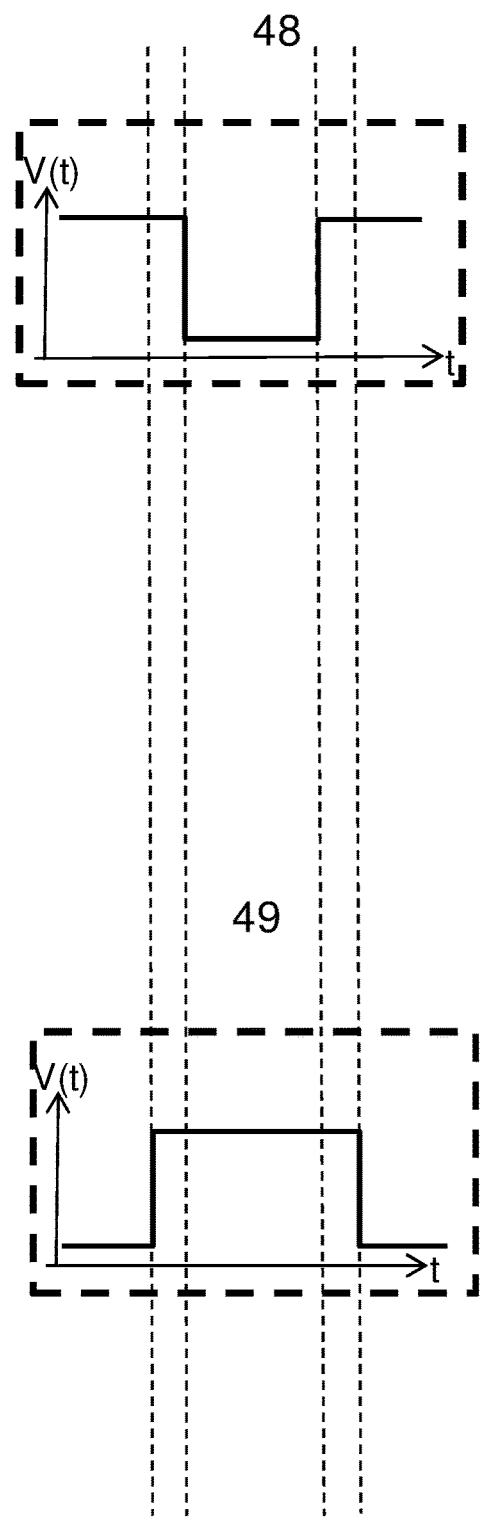
FIG. 5 shows synchronized signals of the window comparator unit according to FIG. 4, in accordance with an embodiment of the present invention.

In FIG. 5 the synchronized signals of the window comparator unit 12, as shown in FIG. 1, according to FIG. 4 are depicted. The first selection pulse signal 48, as shown in FIG. 4, corresponds to the time where the signal 10 is lower than the first reference voltage 36 and the second selection pulse signal 49, as shown in FIG. 4, corresponds to the time where the signal 10 is higher than the second reference voltage 38. Processing the first and second selection pulse signals 48, 49, by the AND gate 46 delivers as an output the two digital pulse signals 47 for the rising edge 90 and the falling edge 92, respectively, shown in FIG. 4.

Figure 6:
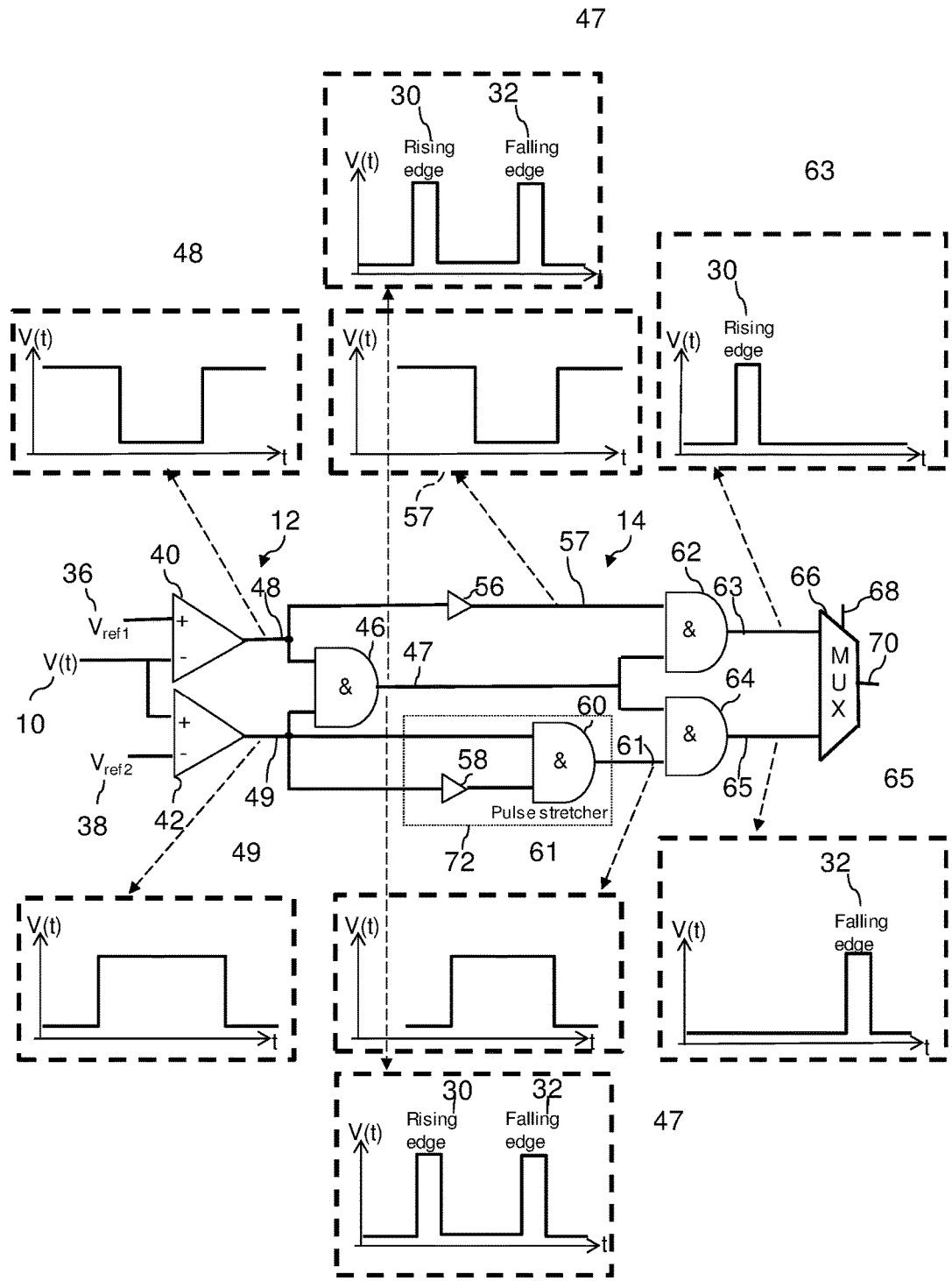
FIG. 6 is a functional diagram of a window comparator unit in connection to an edge selection unit, displaying the processed signals, in accordance with an embodiment of the present invention.
Figure 7:
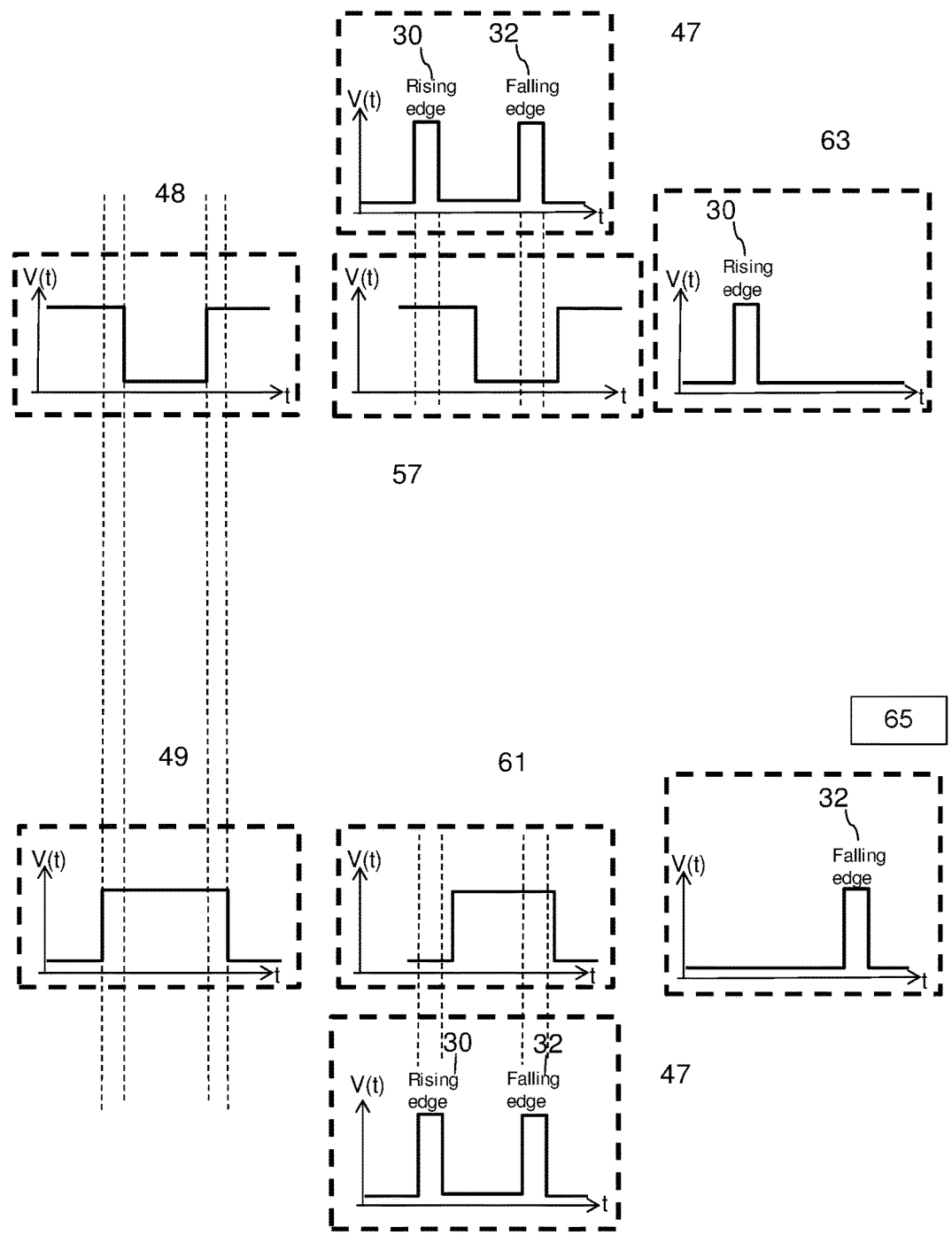
FIG. 7 shows synchronized signals of the edge selection unit according to FIG. 6, in accordance with an embodiment of the present invention.

FIG. 6 shows a functional diagram of the window comparator unit 12, as shown in FIG. 1, in connection to the edge selection unit 14, as shown in FIG. 1, according to an embodiment of the invention, also displaying the processed signals, which are depicted in FIG. 7 as synchronized signals. The window comparator unit 12 exhibits an AND gate 46 as already explained in FIGS. 4 and 5.

The signal 47 from the window comparator unit 12 exhibits two digital pulse signals 30, 32 for the rising and the falling edge 90, 92 of the signal 10. The rising and falling edge 90, 92 of the signal 10 are shown in FIG. 1. A circuit for edge selection is used to observe one of the rising and the falling edge 90, 92. FIG. 6 depicts an example circuit for masking out an irrelevant digital pulse signal 30, 32. To mask out a rising edge of the digital pulse signal 30, a pulse stretcher 72 is used, and to cut out a falling edge of the digital pulse signal 32, a delay element 56 is used. The pulse stretcher 72 includes a delay element 58 and an AND gate 60. The output signal 47 of the window comparator unit 12 is used as input to AND gates 62, 64. The pulse stretcher comprises a double signal chain with a delay element followed by an AND gates 62, 64.

For selecting the rising edge of the digital pulse signal 30, the first selection pulse signal 48, as shown in FIG. 4, of the window comparator unit 12 is delayed via the delay element 56, shown as signal 57 in the insert 57, and fed to the AND gate 62, which delivers as signal 63, the rising edge of the digital pulse signal 30, as shown in the insert 63. In the inserts 57, 63, the x-axis is time and the y-axis is voltage as a function of time.

For selecting the falling edge of the digital pulse signal 32 the signal 49 of the window comparator unit 12 is directly fed into the AND gate 60 of the pulse stretcher 72 and fed a second time delayed via the delay element 58 to the other input of the AND gate 60. Thus the output signal 61, as shown in the insert 61, is delayed and compressed in time, compared to signal 49. If the output signal 61 is added in the AND gate 64 to the signal 47 the falling edge of the digital pulse signal 32 can be selected as an output 65, as shown in the insert 65. In the inserts 61, 65 the x-axis is time and the y-axis is voltage as a function of time.

Both signal 63, and output 65 are fed to a multiplexer 66 in order to select one of the signal 63, and output 65 as output of the edge selection unit 14. With a digital control bit 68 on the multiplexer the relevant signal of one of the rising and the falling edge 90, 92 can be selected, and provided as output 70.

In a preferred embodiment, dimensions of the delay elements 56, 58 may be selected such that all process variations plus the maximum expected slew rate can be handled and the masking out window has a margin in both directions.

In FIG. 7 the synchronized signals of the edge selection unit 14, as shown in FIG. 1, according to FIG. 6 are shown, to clarify the timing of the first and second selection pulse signals 48, 49, as shown in FIG. 4, as well as the digital pulse signals 30, 32 in signal 47 in combination with the signal 57 (a delayed signal of the first selection pulse signal 48), and the output signal 61 (a delayed and compressed signal of the second selection pulse signal 49), respectively. Also shown is signal 63 (the rising edge of the digital pulse signal 30) and the output 65 (the falling edge of the digital pulse signal 32).

Figure 8:
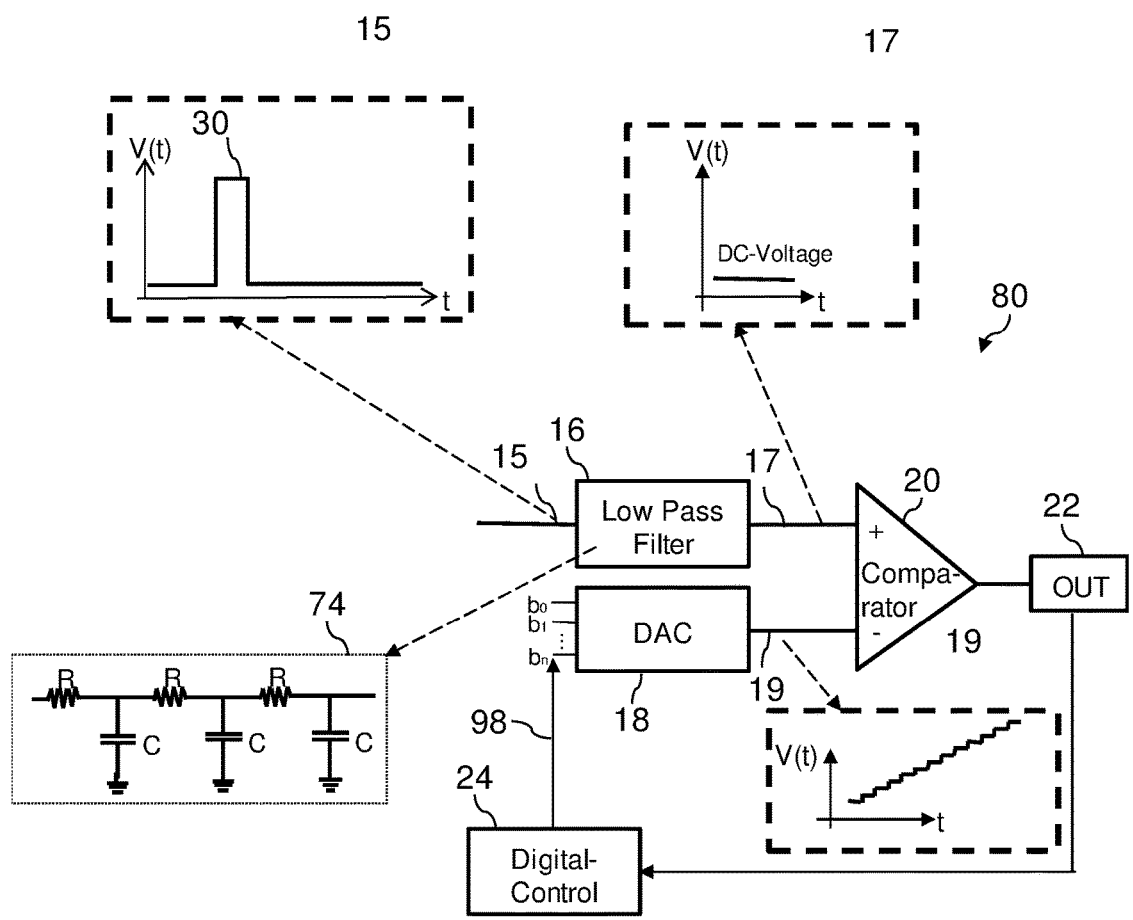
FIG. 8 is a functional diagram of a duty cycle sensor unit according to an embodiment of the invention, displaying the processed signals, in accordance with an embodiment of the present invention.

FIG. 8 shows a functional diagram of a duty cycle sensor unit 80 according to an embodiment of the invention, also displaying the processed signals.

After the edge selection the pulse width of the relevant rising edge or falling edge of the digital pulse signal 30, 32 is determined, of the input signal 15. The integrator unit 16, as shown in FIG. 1, transforms the pulse width of the digital pulse signal 30, 32, which is used as the input signal 15 of the integrator unit 16 and which is shown in insert 15, to a DC voltage 17, as shown in FIG. 1. For example in the embodiment shown in FIG. 8, a low pass filter of $3^{rd}$ order 74, as shown in the insert, is used as integrator unit 16. Higher orders decrease the remaining ripple of the signal 17 after the conversion to DC voltage. The DC voltage is measured by conversion to a binary value 98. This is done by the comparator 20, as shown in FIG. 1, which compares the analog voltage 17 against the reference voltage 19 from the DAC 18, as shown in FIG. 1. The digital control unit 24, as shown in FIG. 1, adjusts the DAC bits from 0 to $2^N-1$, where N is a natural number, on the input lines $b_0$ to $b_n$ and which delivers an output signal 19, shown in the insert 19, to the input of the comparator 20 and compares the switching activity of an output of the output unit 22, as shown in FIG. 1. With methods like, e.g., a binary search the binary value 98 may be found faster. Thus the pulse width measurement corresponds to a duty cycle measurement, as is known in the art. In the inserts 15, 17, the x-axis is time and the y-axis is voltage as a function of time.

The low pass filter of $3^{rd}$ order 74 may include three resistors, shown as R, connected in series between an input, which is connected to input signal 15, and an output of, which is connected to DC voltage 17. The low pass filter of $3^{rd}$ order 74 may include three capacitors, shown as C, between the first and second Rs, between the second and third Rs and between the third R and the output of the low pass filter of $3^{rd}$ order 74.

In FIG. 9, different components for generating a first and second reference voltage 36, 38, or $V_{ref1}$, $V_{ref2}$, according to an embodiment of the invention are depicted. The generation of the first and second reference voltages 36, 38, as shown in FIG. 1, can be realized with fixed values and with adjustable values. For fixed values a resistive voltage divider 76, 78 may be used, with three resistors of the same value connected in series between $V_{dd}$ and ground, shown as R in voltage divider 76, and four resistors of the same value, connected in series between $V_{dd}$ and ground, shown as R in voltage divider 78, FIG. 9. $V_{dd}$ may be the power supply voltage. There it is possible to adjust a fixed ratio. For example, the resistive voltage divider 76 may be used to generate a first reference voltage 36 of $0.66V_{dd}$ as well as a second reference voltage 38 of $0.33V_{dd}$, whereas the resistive voltage divider 78 may be used to generate a first reference voltage 36 of $0.6V_{dd}$ as well as a second reference voltage 38 of $0.4V_{dd}$, where $V_{dd}$ is the voltage corresponding to a full cycle of the signal 10. The ratios of the first and second reference voltage 36, 38 compared to the full signal voltage $V_{dd}$ may serve as an example. For instance, the first reference voltage 36 may be a higher voltage—than the second reference voltage 38. Favorably, values of a first reference voltage 36 of $0.9V_{dd}$ and a second reference voltage 38 of $0.1V_{dd}$ may be used.

An example for generating adjustable reference voltages 36, 38 is a digital to analog converter (DAC), 82, 84, where by input of a digital value a corresponding analog output may be generated.

Figure 10:
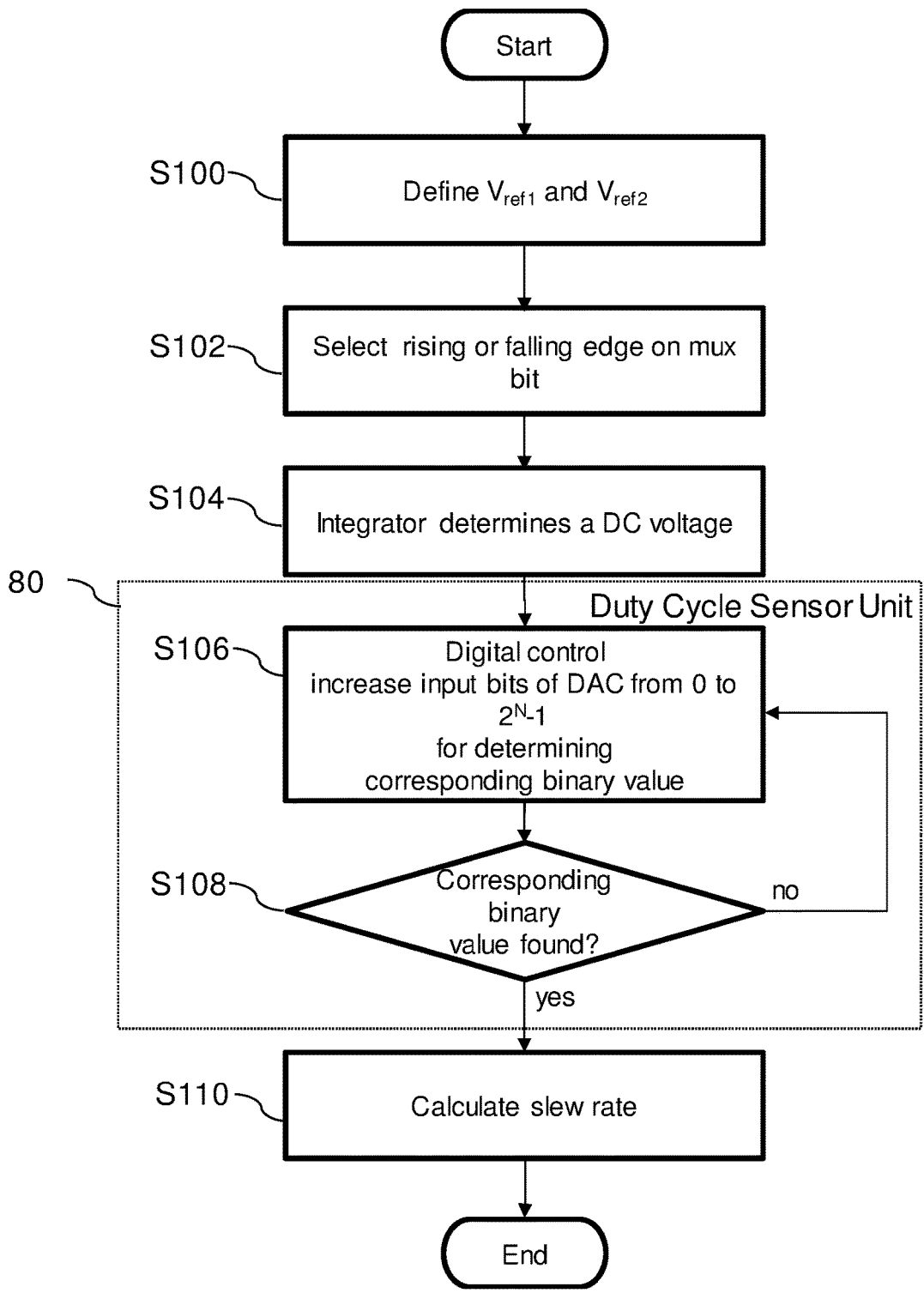
FIG. 10 is a flowchart of the method for measuring a slew rate of a digital high speed repeating signal on-chip, in accordance with an embodiment of the present invention.

FIG. 10 depicts a flowchart of an inventive method for measuring a slew rate of a digital high speed repeating signal on-chip.

According to the inventive method the rising and the falling edges of the signal are transformed into a digital pulse signal each, wherein a pulse width of the digital pulse signal corresponds to the slew rate of the rising and the falling edges. The one of the digital pulse signals corresponding either to the rising edge or to the falling edge of the signal is selected. The selected digital pulse signal is converted into an average DC voltage equivalent to the pulse width of the respective digital pulse signal, followed by converting each DC voltage into a binary value.

Thus, referring to the flowchart in FIG. 10, in step S100 the first reference voltage $V_{ref1}$ and the second reference voltage $V_{ref2}$ are defined.

Next in step S102 a rising or a falling edge of the digital signal, converted to the digital pulse signal, may be selected by a corresponding digital control bit for choosing an output of a multiplexer. For this purpose the rising and falling edges of the signal are transformed into a digital pulse signal each, comprising the generation of a first selection pulse signal, when a voltage of the signal passes a first reference voltage and the generation of a second selection pulse signal, when the voltage of the signal passes a second reference voltage. The first selection pulse signal is generated, when a voltage of the signal is higher or lower than a first reference voltage and the second selection pulse signal is generated, when the voltage of the signal is higher than a second reference voltage. Comparing the first selection pulse signal to the second selection pulse signal may be performed by using an XOR gate or an AND gate.

Masking out the digital pulse signal may be performed by adding the first selection pulse signal and the second selection pulse signal to the digital pulse signal, wherein the first selection pulse signal or the second selection pulse signal is shifted in time against the digital pulse signal for eliminating one of the digital pulse signals. Then one of the remaining digital pulse signals is selected for output.

Next the selected signal is fed to an integrator unit in order to convert the pulse width into a corresponding DC voltage in step S104. Converting the selected digital pulse signal into an average DC voltage equivalent to the pulse width comprises integration of the digital pulse signal over time.

Steps S106 and S108 represent the duty cycle sensor unit 80. Converting the DC voltage into a binary value comprises adjusting a reference voltage generated by a digital-to-analog converter, which reference voltage is compared to the DC voltage and outputting a binary value of the digital-to-analog converter if the reference voltage is equal to the DC voltage. Therefore the digital control unit increases an input of the DAC from 0 to $2^N-1$, on the input lines $b_0$ to $b_n$, where N equals a natural number, in order to determine the binary value corresponding to the DC voltage. This is repeated, until the binary value is found. A pulse width of the digital pulse signals is determined by dividing the DC voltage by the voltage of the signal times a cycle time of the signal, as shown by equation 1, repeated below:

$$\text{Pulse\_width} = (DC\_\text{voltage}/V_{dd}) \times P_{cycletime} \quad (1)$$

Finally in step S110 a slew rate of the selected rising or falling edge of the digital signal may be calculated by equation 2, repeated below.

$$\text{Slew\_rate} = (V_{ref1} - V_{ref2})/\text{Pulse\_width} \quad (2)$$

Figure 11:
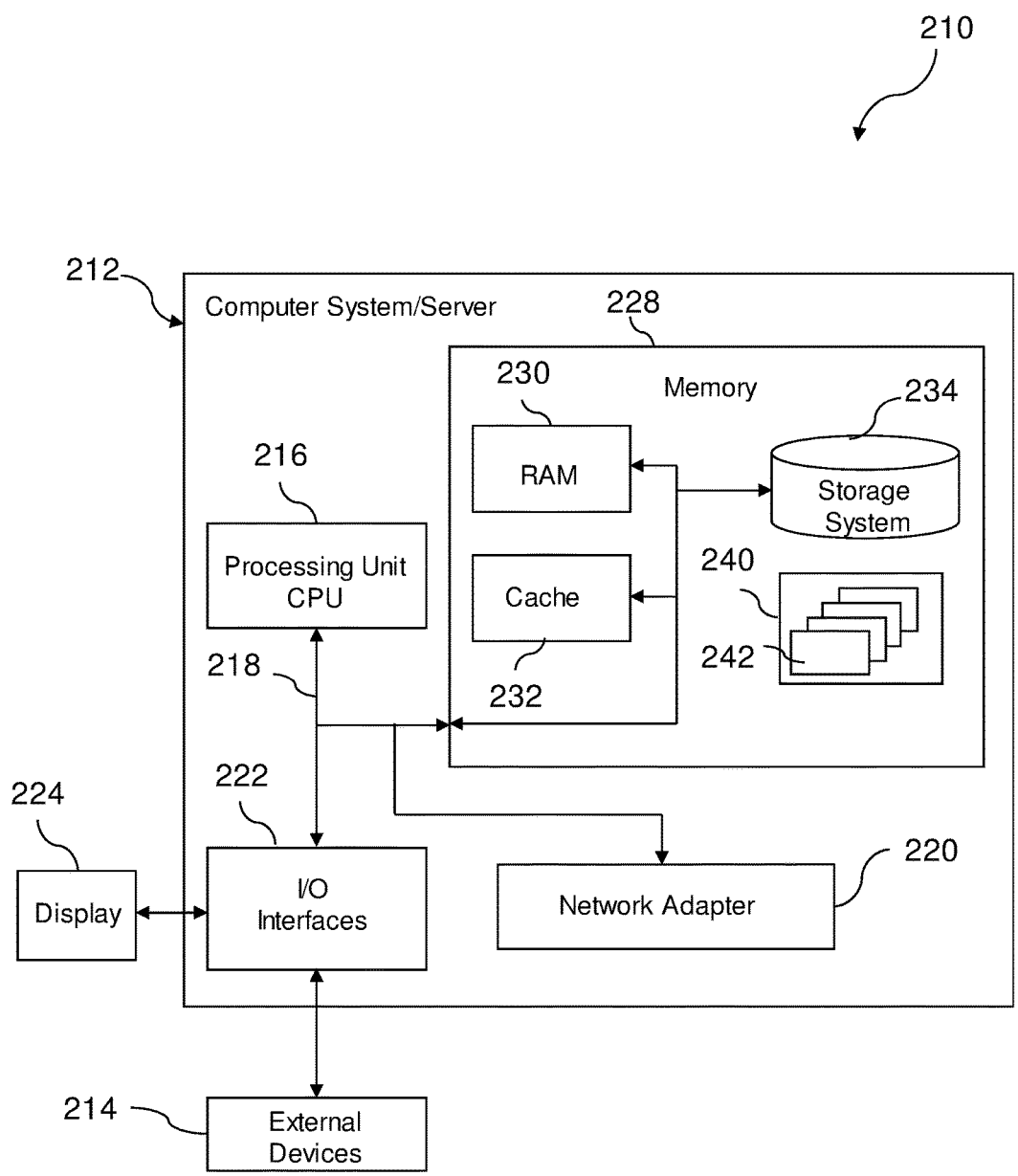
FIG. 11 is an example embodiment of a data processing system for executing a method, in accordance with an embodiment of the present invention.

Referring now to FIG. 11, a schematic of an example of a data processing system 210 is shown. Data processing system 210 is an example of a suitable data processing system and is not intended to suggest any limitation as to the scope of use or functionality of embodiments of the invention described herein. Data processing system 210 is capable of being implemented and/or performing any of the functionality set forth herein above.

In data processing system 210 there is a computer system/server 212, which is operational with numerous other general purpose or special purpose computing system environments or configurations. Examples of well-known computing systems, environments, and/or configurations that may be suitable for use with computer system/server 212 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 212 may be described in the general context of computer system executable instructions, such as program modules, being executed by a computer system. Generally, program modules may include routines, programs, objects, components, logic, data structures, and so on that perform particular tasks or implement particular abstract data types. Computer system/server 212 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 11, computer system/server 212 in data processing system 210 is shown in the form of a general-purpose computing device. The components of computer system/server 212 may include, but are not limited to, one or more processors or processing units 216, a system memory 228, and a bus 218 that couples various system components including system memory 228 to processor 216.

Bus 218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 212 typically includes a variety of computer system readable media. Such media may be any available media that is accessible by computer system/server 212, and it includes both volatile and non-volatile media, removable and non-removable media.

System memory 228 can include computer system readable media in the form of volatile memory, such as random access memory (RAM) 230 and/or cache memory 232. Computer system/server 212 may further include other removable/non-removable, volatile/non-volatile computer system storage media. By way of example only, storage system 234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 218 by one or more data media interfaces. As will be further depicted and described below, memory 228 may include at least one program product having a set (e.g., at least one) of program modules that are configured to carry out the functions of embodiments of the invention.

Program/utility 240, having a set (at least one) of program modules 242, may be stored in memory 228 by way of example, and not limitation, as well as an Operating System, one or more application programs, other program modules, and program data. Each of the Operating System, one or more application programs, other program modules, and program data or some combination thereof, may include an implementation of a networking environment. Program modules 242 generally carry out the functions and/or methodologies of embodiments of the invention as described herein.

Computer system/server 212 may communicate with one or more external devices 214 such as a keyboard, a pointing device, a display 224, etc.; one or more devices that enable a user to interact with computer system/server 212; and/or any devices (e.g., network card, modem, etc.) that enable computer system/server 212 to communicate with one or more other computing devices. Such communication can occur via Input/Output (I/O) interfaces 222. Still yet, computer system/server 212 can communicate with one or more networks such as a local area network (LAN), a general wide area network (WAN), and/or a public network (e.g., the Internet) via network adapter 220. As depicted, network adapter 220 communicates with the other components of computer system/server 212 via bus 218. It should be understood that although not shown, other hardware and/or software components could be used in conjunction with computer system/server 212. Examples, include, but are not limited to: microcode, device drivers, redundant processing units, external disk drive arrays, RAID systems, tape drives, and data archival storage systems, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for measuring a slew rate of a rising and a falling edge of a digital high speed repeating signal on-chip, comprising:
   transforming a rising and a falling edge of the repeating signal into a first and a second digital pulse signal, wherein a pulse width of the first and second digital pulse signals corresponds to the slew rate of the rising and the falling edges;
   selecting the first digital pulse signal corresponding to the rising edge of the repeating signal;
   selecting the second digital pulse signal corresponding to the falling edge of the repeating signal;
   converting the first digital pulse signal into a first average DC voltage equivalent to the pulse width of the first digital pulse signal;
   converting the second digital pulse signal into a second average DC voltage equivalent to the pulse width of the second digital pulse signal;
   converting the first average DC voltage into a first binary value corresponding to the slew rate of the rising edge of the repeating signal; and
   converting the second average DC voltage into a second binary value corresponding to the slew rate of the falling edge of the repeating signal.

2. The method according to claim 1, wherein transforming the rising and falling edges of the repeating signal into the first and the second digital pulse signals comprises:
   generating a first selection pulse signal, when a voltage of the repeating signal passes a first reference voltage; and
   generating a second selection pulse signal, when the voltage of the repeating signal passes a second reference voltage, in particular wherein the first reference voltage is higher than the second reference voltage.

3. The method according to claim 2, further comprises:
   comparing the first selection pulse signal to the second selection pulse signal by using an XOR gate or an AND gate.

4. The method according to claim 3, wherein selecting the first digital pulse signal comprises:
   masking out the second digital pulse signal by adding the first selection pulse signal and the second selection pulse signal to a combined digital pulse signal, wherein the first selection pulse signal is shifted in time against the combined digital pulse signal to eliminating the second selection pulse signal; and
   selecting the first digital pulse signal for output.

5. The method according to claim 1, wherein converting the first digital pulse signal into a first average DC voltage equivalent to the pulse width comprises integration of the first digital pulse signal over time.

6. The method according to claim 1, wherein converting the first average DC voltage into a binary value comprises:
   adjusting a reference voltage generated by a digital-to-analog converter, where the reference voltage is compared to the first average DC voltage; and
   outputting a binary value of the digital-to-analog converter when the reference voltage is equal to the first average DC voltage.

7. The method according to claim 1, wherein the pulse width of the first digital pulse signal is determined by multiplying a full cycle time of the repeating signal and the first average DC voltage, and then dividing by a voltage corresponding to a full cycle of the repeating signal.

8. An apparatus for measuring a slew rate of a rising and a falling edge of a digital high speed repeating signal on-chip comprising:
   a window comparator unit, configured to transform the rising and the falling edges of the repeating signal into a first and a second digital pulse signal, wherein a pulse width of the first and second digital pulse signals corresponds to the slew rates of the rising and the falling edges;
   an edge selection unit, configured to select one of the first and the second digital pulse signals corresponding to the rising edge or to the falling edge of the repeating signal, and is configured to select a second one of the first and the second digital pulse signals corresponding to the rising edge or the falling edge of the repeating signal; and
   a duty cycle sensor unit, configured to convert the selected digital pulse signals into an average DC voltage equivalent to the pulse width of the respective digital pulse signal, and to convert each DC voltage into a binary value, where the binary values each correspond to the slew rate of the rising edge and the falling edge of the repeating signal.

9. The apparatus according to claim 8, wherein the window comparator unit comprises:
   a first comparator for generating a first selection pulse signal when the repeating signal passes a first reference voltage and a second comparator for generating a second selection pulse signal when the repeating signal passes a second voltage.

10. The apparatus according to claim 9, wherein the window comparator unit comprises:
    an XOR gate or an AND gate for comparing the first selection pulse signal and the second selection pulse signal.

11. The apparatus according to claim 8, wherein the edge selection unit comprises a pulse stretcher for delaying the first selection pulse signal or the second selection pulse signal to eliminate one of the digital pulse signals followed by a multiplexer to select the remaining digital pulse signal.

12. The apparatus according to claim 8, wherein the integrator unit comprises a low pass filtering unit.

13. The apparatus according to claim 8, wherein the duty cycle sensor unit comprises:
    an integrator unit, a digital to analog converter, a comparator, an output unit and a digital control unit.

14. The apparatus according to claim 8, further comprising resistive voltage dividers for creating the first reference voltage and the second reference voltage.

15. The apparatus according to claim 8, further comprising digital-to-analog converters for creating the first reference voltage and the second reference voltage.

16. The apparatus according to claim 11, wherein the pulse stretcher comprises a double signal chain with a delay element followed by an AND gate.

17. The apparatus according to claim 8, wherein the duty cycle sensor unit comprises a digital control unit for providing the binary value as input to the digital-to-analog converter.

18. The apparatus according to claim 17, wherein the digital control unit is used for selecting the digital pulse signal in the edge selection unit.

19. A computer program product for measuring a slew rate of a digital high speed repeating signal on-chip, the computer program product comprising:
one or more computer-readable storage media and program instructions stored on the one or more computer-readable storage media, the program instructions comprising:
program instruction to transform the rising and the falling edges of the repeating signal into a digital pulse signal each, wherein a pulse width of the digital pulse signal corresponds to the slew rate of the rising and the falling edges;
program instructions to select one of the digital pulse signals corresponding either to the rising edge or to the falling edge of the repeating signal;
program instructions to select the other one of the pulse signals corresponding either to the falling edge or to the rising edge of the repeating signal;
program instructions to convert the selected digital pulse signals into an average DC voltage equivalent to the pulse width of the respective digital pulse signal; and
program instructions to convert each DC voltage into a binary value.

20. The computer program product according to claim 19, further comprising:
program instructions to generate a first selection pulse signal, when a voltage of the repeating signal passes a first reference voltage; and
program instructions to generate a second selection pulse signal, when the voltage of the repeating signal passes a second reference voltage, in particular wherein the first reference voltage is higher than the second reference voltage.

* * * * *